(12) United States Patent
Acker

(10) Patent No.: US 10,027,337 B2
(45) Date of Patent: Jul. 17, 2018

(54) DEVICE FOR DIGITIZING AN ANALOGUE SIGNAL

(71) Applicant: Continental Teves AG & Co. oHG, Frankfurt (DE)

(72) Inventor: Heinrich Acker, Schwalbach (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 0 days.

(21) Appl. No.: 15/504,150

(22) PCT Filed: Sep. 25, 2015

(86) PCT No.: PCT/EP2015/072075
§ 371 (c)(1),
(2) Date: Feb. 15, 2017

(87) PCT Pub. No.: WO2016/046356
PCT Pub. Date: Mar. 31, 2016

(65) Prior Publication Data
US 2017/0279458 A1    Sep. 28, 2017

(30) Foreign Application Priority Data
Sep. 26, 2014  (DE) .................. 10 2014 219 531

(51) Int. Cl.
| H03M 1/06 | (2006.01) |
| H03M 1/12 | (2006.01) |
| H03M 1/10 | (2006.01) |
| H03M 1/00 | (2006.01) |
| H03M 1/60 | (2006.01) |

(52) U.S. Cl.
CPC ......... *H03M 1/0626* (2013.01); *H03M 1/002* (2013.01); *H03M 1/0614* (2013.01); *H03M 1/1009* (2013.01); *H03M 1/124* (2013.01); *H03M 1/60* (2013.01)

(58) Field of Classification Search
CPC ...... H03M 1/0626; H03M 1/60; H03M 1/124; H03M 1/002
USPC ................. 341/118, 120, 155, 142
See application file for complete search history.

(56) References Cited

U.S. PATENT DOCUMENTS

| 6,091,213 | A | * | 7/2000 | Park ..................... H04N 3/2335 315/370 |
| 6,172,629 | B1 | | 1/2001 | Fetterman |
| 2005/0219088 | A1 | * | 10/2005 | Batruni ............... H03M 1/0612 341/118 |

(Continued)

FOREIGN PATENT DOCUMENTS

| EP | 0520662 A2 | 12/1992 |
| JP | H05276042 A | 10/1993 |
| KR | 20070058376 A | 6/2007 |

OTHER PUBLICATIONS

International Search Report and Written Opinion for International Application No. PCT/EP2015/072075, dated Jan. 7, 2016, 10 pages.

(Continued)

*Primary Examiner* — Peguy Jean Pierre
(74) *Attorney, Agent, or Firm* — RatnerPrestia

(57) ABSTRACT

A device for digitizing an analog signal, wherein a distortion signal outlet of a distortion signal generator is only coupled to an analog digital converter by passive components.

20 Claims, 2 Drawing Sheets

(56) References Cited

U.S. PATENT DOCUMENTS

| | | | |
|---|---|---|---|
| 2011/0098011 A1* | 4/2011 | Camp, Jr. | H03F 1/0222 |
| | | | 455/114.3 |
| 2013/0088080 A1* | 4/2013 | Smith | H02M 1/126 |
| | | | 307/43 |
| 2014/0132431 A1 | 5/2014 | Steensgaard-Madsen | |
| 2016/0211856 A1* | 7/2016 | Muhammad | H03M 1/0626 |

OTHER PUBLICATIONS

German Search Report for German Application No. 10 2014 219 531.4, dated Aug. 31, 2015, including partial English translation, 9 pages.

Korean Notice of Grounds for Rejection for Korean Application No. 10-2017-7008073, dated Jan. 12, 2018, including English translation, 11 pages.

\* cited by examiner

DEVICE FOR DIGITIZING AN ANALOGUE SIGNAL

CROSS REFERENCE TO RELATED APPLICATIONS

This application is the U.S. National Phase Application of PCT International Application No. PCT/EP2015/072075, filed Sep. 25, 2015, which claims priority to German Patent Application No. 10 2014 219 531.4, filed Sep. 26, 2014, the contents of such applications being incorporated by reference herein.

FIELD OF THE INVENTION

The invention relates to an apparatus for digitizing an analog signal. The apparatus has an analog-to-digital converter having a signal input for the signal. The apparatus further has a distortion signal generator having a distortion signal output, wherein the distortion signal generator is designed to deliver a distortion signal at the distortion signal output.

BACKGROUND OF THE INVENTION

Apparatuses of the type in question are used particularly in order to convert analog signals into digital signals, for example in order to be able to evaluate and further process signals delivered by a sensor by means of electronic data processing in a microcontroller or another control unit. The distortion signal generator is used in this case particularly to increase the resolution of the analog-to-digital converter. The background to the use of such a distortion signal generator is the fact that although many analog-to-digital converters have a sampling frequency that is much faster than required for a particular purpose, their resolution, that is to say the minimum distinguishable signal level, means that at the same time they allow only excessively coarse capture of the signal. For analog-to-digital converters, the resolution is usually indicated in bits.

By way of example, analog-to-digital converters can have a sampling rate of 100 kHz to 200 kHz, whereas the bandwidth of measured variables from a connected sensor, particularly in the automotive sector, may be below 1 kHz, for example. In this case, the resolution is frequently in the order of magnitude of approximately 10 bits, whereas resolutions of 13 bits or 14 bits, for example, would be desirable in numerous applications.

The distortion signal generator is therefore used to perform a conversion of the temporal resolution into a higher sampling accuracy. This method is also referred to as dithering. This involves the signal to be digitized having noise with a low RMS value added to it, typically in the order of magnitude of a few least significant bits (LSB). A resultant signal that is then digitized by the analog-to-digital converter fluctuates by the value corresponding to the signal to be digitized having the instantaneous value of the distortion signal. If the distortion signal has the mean value zero, for example, then the mean value of many output values from the analog-to-digital converter can correspond to the correct output value of the constant signal to be digitized. This mean value has a higher resolution, however. The reason is that mean value formation gives rise to digits having a lower value than 1 LSB. In principle, the use of both random noise and pseudo noise as a distortion signal is available for this purpose. In the case of random noise, there is no absolute certainty that the mean value for a group of, by way of example, fifty successive values of the noise is actually also zero. Random noise of this kind can be generated by a random number generator, for example, which is based on the observation of a natural phenomenon such as radioactive decay, for example. The use of random noise typically involves the use of a mathematical function that generates pseudo random numbers on the basis of an output value. These pseudo random numbers have defined properties; in particular, it is possible to compute how many pseudo random numbers need to be grouped in order to achieve a mean value of zero. Even if the mean value of such a group is not zero, the pseudo noise can still be used, since the mean value is known and can simply be compensated for computationally.

When using random noise, reference is particularly also made to "random dithering", whereas "deterministic dithering" is also referred to when using pseudo random numbers. It has been found that when pseudo random numbers are used, it is also possible to use a simply defined signal such as a triangular waveform signal or sawtooth signal, for example. If a mean value of zero is intended to be achieved in this case, this can typically be accomplished by virtue of the period from which the values used come, which are averaged to form a value, comprising an integer number of periods of the relevant distortion signal. In principle, however, it even suffices if the mean value is constant and known, since there is the possibility of computational compensation.

In the case of apparatuses of the type in question, the implementation of deterministic dithering typically involves the use of a distortion signal generator, an adder, an analog-to-digital converter and a microcontroller. In this case, the adder typically caters for superimposition of the distortion signal over the analog signal to be digitized, whereupon said signal is digitized by the analog-to-digital converter and forwarded in digitized form to the microcontroller. The microcontroller subsequently forms the mean value over a number of measured values, resorting to information from the distortion signal generator. Adders are typically designed using active components such as operational amplifiers. It has been found that although embodiments of this kind achieve a high resolution and are suitable for numerous purposes, they are also, on the other hand, complex and expensive to produce.

SUMMARY OF THE INVENTION

An aspect of the invention provides an apparatus for digitizing an analog signal that is embodied more simply in comparison with apparatuses according to the prior art.

An aspect of the invention relates to an apparatus for digitizing an analog signal. The apparatus has an analog-to-digital converter having a signal input for the signal. The apparatus further has a distortion signal generator having a distortion signal output, wherein the distortion signal generator is designed to deliver a distortion signal at the distortion signal output.

According to an aspect of the invention, the distortion signal output is coupled to the analog-to-digital converter exclusively by means of passive components.

An aspect of the invention is based on the insight that the use of a conventional adder embodied by means of active components such as operational amplifiers is not absolutely necessary in order to achieve sufficient accuracy for many applications. Instead, passive components, particularly resistors (R) and/or capacitors (C) and also possibly inductances (L), are suitable for this purpose.

The order of magnitude of the distortion signal is in this case typically a few least significant bits (LSB), for example 1, 2 or 3 LSB. In particular, the order of magnitude of the distortion signal is typically much smaller than the order of magnitude of the signal to be digitized, for example the distortion signal can have a maximum absolute value that is less than 10% or less than 5% of the maximum absolute value of the analog signal to be digitized. In this case, the distortion signal is preferably deterministic, for example a triangular waveform signal or sawtooth signal or else a pseudo random number signal. Preferably, the distortion signal has a mean value of zero, but this is not absolutely necessary, since a mean value differing from zero can be compensated for computationally without any problem. The analog-to-digital converter is preferably in sync with the distortion signal generator. Instead of the analog-to-digital converter, it is also possible, by way of example, for a microcontroller that receives and/or evaluates a signal delivered by the analog-to-digital converter to be correspondingly in sync with the distortion signal generator. A synchronization can involve particularly information about the distortion signal being transmitted.

According to one embodiment, the distortion signal output is coupled to the analog-to-digital converter without active components, particularly without an operational amplifier. This allows a particularly advantageous reduction in complexity and hence in costs. The inventor of the present application has found that it is still possible to achieve sufficient accuracy and quality for many and diverse applications.

Preferably, the analog-to-digital converter is part of a microcontroller. This allows direct further processing of the signals produced by the analog-to-digital converter, particularly, mean value formation and also use in further computations.

As a further preference, the distortion signal generator is likewise part of the microcontroller. This allows particularly advantageous simplification of the design, since the microcontroller that contains the analog-to-digital converter can also produce the distortion signal at the same time. In this case, the distortion signal generator may be implemented by means of a digital output of the microcontroller, for example, which forms the distortion signal output. Digital outputs of this kind are frequently present in microcontrollers, for example in order to perform control functions. They are typically switchable in a defined manner via internal registers or counters, the circuit being able to be controlled by software. This allows software implementation of the distortion signal by means of appropriate actuation of the digital output of the microcontroller.

According to one embodiment, the analog-to-digital converter has a differential input, wherein the distortion signal output is coupled to a connection of the differential input. Such an embodiment is advantageous particularly when the signal to be digitized is ground referenced. A differential input is typically an input in which the signal to be digitized is ascertained by the analog-to-digital converter between a positive signal input and a negative signal input. The signal to be digitized can in this case be connected particularly to the positive signal input, whereas the distortion signal output is coupled to the negative input of the analog-to-digital converter. The converse embodiment is also possible, however. When using an analog-to-digital converter having a differential input, the adder provided according to the prior art for producing a superimposition can be replaced by virtue of the distortion signal output being coupled in a simple manner to an input of the analog-to-digital converter. This allows a particularly simple and nevertheless just as functional embodiment.

Preferably, the distortion signal output and a reference potential, preferably ground, have a voltage divider connected between them in this case, wherein the connection of the differential input is connected to an output of the voltage divider. This means that a voltage that is applied to the distortion signal output and that is typically much higher than needed, since it is typically the supply voltage for the microcontroller, can be decreased to a desired, much lower value. This much lower voltage is then used for distorting the measurement of the analog-to-digital converter. The connection of the differential input and the reference potential preferably further have a capacitor connected between them in this case, which further preferably spans at least one resistor of the voltage divider. This means that the distortion signal output can be used to set a respective voltage applied to the connection of the differential input, for example by means of pulse width modulation. The capacitor is in this case charged, by way of example, just until it has the desired voltage.

According to an embodiment that is simple to realize, a symmetrical square wave voltage is output at the distortion signal output, as a result of which charging and discharging curves are produced at the capacitor that typically each follow an exponential function. These can be used in the manner of the aforementioned triangular waveform or sawtooth voltages.

According to an alternative embodiment, the analog-to-digital converter has a reference input in addition to the signal input. The distortion signal output is coupled to the reference input in this case. This means that in the case of analog-to-digital converters that have no differential input, it is still possible to achieve direct coupling of the distortion signal output to the analog-to-digital converter, this involving the use of the reference input, which, in the case of typical analog-to-digital converters, particularly in microcontrollers, is typically intended, according to the manufacturer specification, to be connected to a connection of one of the supply voltages, but can also be coupled to the distortion signal output, as the inventor has recognized. In this case, a division operation is typically carried out in the analog-to-digital converter for the reference input. This is typically thus not a superimposition of the distortion signal over the signal to be digitized by addition or subtraction, but rather by division, which can easily be taken into consideration for the further processing as part of a computation, however. As a result of the division instead of addition or subtraction, it is also possible to talk about the process no longer being referred to as dithering. The effect is very similar, however.

Preferably, the distortion signal output and a reference potential, preferably a positive potential, have a voltage divider connected between them in this case, wherein the reference input is connected to an output of the voltage divider. This means that it is possible for the signal to be matched to the desired order of magnitude in a similar manner to that already described above.

The reference input and the reference potential preferably have a capacitor connected between them in this case, which further preferably spans at least one resistor of the voltage divider. This means that the desired voltage can be set particularly by pulse width modulation or the square wave voltage already described further above in the same way as already described further above.

According to one embodiment, the distortion signal output and a signal connection delivering the signal are coupled to the signal input. This allows superimposition of the signal to be digitized, which is provided by the signal connection, and the distortion signal. In this case, the superimposition is thus effected not inside the analog-to-digital converter, as in the case of the two embodiments already described, but rather outside. In this case too, as the inventor of the present application has recognized, it is possible to resort to exclusively passive components, which saves considerable complexity and costs. Sufficient quality for most purposes is still obtained.

The distortion signal output is preferably coupled by DC voltage to the signal input in this case, the coupling being effected in particular conductively in this case. The signal connection is in this case preferably coupled by AC voltage to the signal input, specifically as a further preference capacitively. The DC voltage coupling of the distortion signal output achieves direct introduction of the distortion signal into the analog-to-digital converter. The capacitive coupling of the signal connection achieves DC voltage decoupling of the distortion signal output from the signal connection. It should be mentioned that the embodiment described here is advantageous particularly when the signal applied to the signal connection has a minimum frequency, at least in respect of its relevant frequency components, frequency components below this minimum frequency not being relevant. In particular, the signal should have no relevant DC voltage component.

Alternatively, the converse embodiment can also be used, i.e. the distortion signal output may be coupled by AC voltage to the signal input, whereas the signal connection is coupled by DC voltage. This may be advantageous particularly when the signal has a relevant DC voltage component or particularly low frequencies.

Preferably the distortion signal output and a reference potential, preferably ground, have a voltage divider connected between them, wherein the signal input is connected to an output of the voltage divider. As already described further above, this achieves matching for the order of magnitude of the distortion signal. Following a digitization, signal demodulation is performed, for example in the microcontroller, for the signal delivered by the analog-to-digital converter, according to one embodiment. This means that components of AC voltage signals can advantageously be identified. This can be accomplished by resorting to known algorithms.

In the case of embodiments having a voltage divider, particularly in the case of those that have been described further above, a resistor of the voltage divider that is connected between the distortion signal output and the output of the voltage divider is preferably larger than a resistor that is connected between the output of the voltage divider and the reference potential. This achieves an advantageous reduction in the size of the signal applied to the distortion signal output, which is typically a supply voltage for a microcontroller and hence too large in terms of absolute value.

BRIEF DESCRIPTION OF THE DRAWINGS

Further features and advantages will be deemed by a person skilled in the art from the exemplary embodiment described below with reference to the appended drawing, in which.

DETAILED DESCRIPTION OF THE PREFERRED EMBODIMENTS

Figure 1:
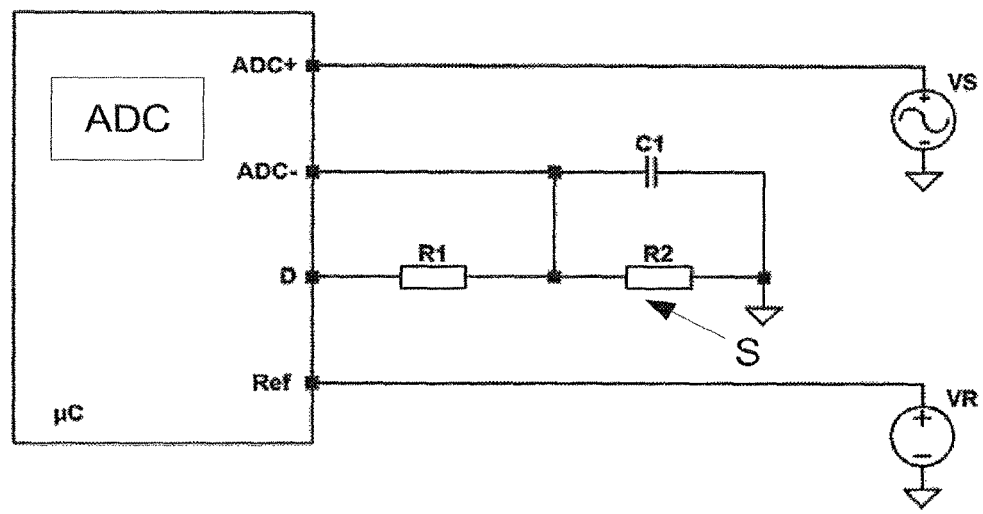
FIG. 1: shows a microcontroller having circuitry according to a first exemplary embodiment.

FIG. 1 shows a microcontroller µC that has an integrated analog-to-digital converter ADC. The latter has a differential input, wherein the differential input has a positive connection ADC+ and a negative connection ADC−. A voltage difference applied between the two connections ADC+, ADC− is digitized by the analog-to-digital converter ADC.

The microcontroller µC has a digital output D, which is used in the present case as a distortion signal output. The microcontroller µC is therefore also used as a distortion signal generator at the same time. The microcontroller has software implemented in it that ensures that the digital output D can be actuated in pulse width modulated fashion or with a square wave signal, for example in a manner as already described further above, so that the circuit described below is used to produce a defined distortion signal. A frequency of a square wave signal or of another signal can be determined particularly by means of software in this case.

The digital output D is connected to ground via a voltage divider S, wherein the voltage divider S has a first resistor R1 and a second resistor R2. The first resistor R1 has a much higher resistance value in this case than the second resistor R2. Hence, the signal delivered by the digital output D, which can alternate between ground and a supply voltage for the microcontroller µC, is divided down to a substantially smaller value that, in the present case, corresponds in terms of voltage to three least significant bits (LSB) of the analog-to-digital converter ADC. The second resistor R2 moreover has a capacitor C1 interconnected across it that can be charged by the voltage divider S. The capacitor C1 is in this case connected to an output of the voltage divider S that is situated between the two resistors R1, R2. When the digital output D assumes a positive potential, the capacitor C1 is charged in this manner. When the digital output D assumes a negative potential, the capacitor C1 is discharged. This allows accurate setting of the voltage of the capacitor C1. By way of example, the distortion signal can be produced as a sequence of different pulse width modulation settings at the digital output D. However, it is also possible for intermediate values to be produced at the output of the voltage divider S using the capacitor C1, particularly between the values that the output of the voltage divider S assumes at a high and a low potential at the distortion signal output. In this case, measurements are thus taken particularly while the voltage at the output of the voltage divider S rises and falls, the design of the components preferably being proportioned such that the voltage rises and falls uniformly.

The output of the voltage divider S and that connection of the capacitor C1 that is connected thereto are furthermore connected to the negative connection ADC− of the analog-to-digital converter ADC. Hence, the signal applied to the positive connection ADC+ is digitized relative to a voltage value that is adjustable by means of the digital output D. This allows superimposition of a distortion signal adjustable by the digital output D in a similar manner to how this would take place in the event of superimposition of the distortion signal by means of an upstream adder, as customary in the prior art. Use of the active components necessary for this purpose according to the prior art can be dispensed with, however.

The positive connection ADC+ has a signal VS applied to it that is intended to be digitized. In the present case, the microcontroller μC further has a reference connection Ref that is connected to a reference voltage VR. The latter is used internally in the microcontroller μC, but is of no further relevance to the interconnection shown in FIG. 1.

The microcontroller μC is furthermore designed to produce a defined signal train, in the present case in the form of a sawtooth signal, at the negative connection ADC−. To this end, the digital output D is actuated as appropriate, so that the capacitor C1 assumes the necessary voltages. Since the microcontroller μC produces these values itself, it knows them too and is able to evaluate the signals delivered by the analog-to-digital converter ADC as appropriate. In particular, a multiplicity of measurements carried out successively are used to form a mean value, this mean value being more accurate than the resolution of the analog-to-digital converter ADC. The possible sampling frequency of the analog-to-digital converter ADC is substantially higher than would be required for sampling the signal VS, however. The mean value formation just described using the distortion signal can consequently convert the higher, but not immediately needed, temporal resolution into a better sampling resolution. This affords advantages for numerous applications, since it is possible to dispense with the use of a higher-quality, possibly external analog-to-digital converter.

It should be mentioned that the use of a sawtooth signal as distortion signal is advantageous in many applications. Said signal can be produced at the digital output D by means of a sequence of pulse width modulation signals, for example. However, a good approximation of a triangular function is also possible, particularly from sections of an exponential function during charging and discharge of the capacitor C1. This is based particularly on the insight that the rise in the voltage across the capacitor C1 is the same for charging and discharge.

Figure 2:
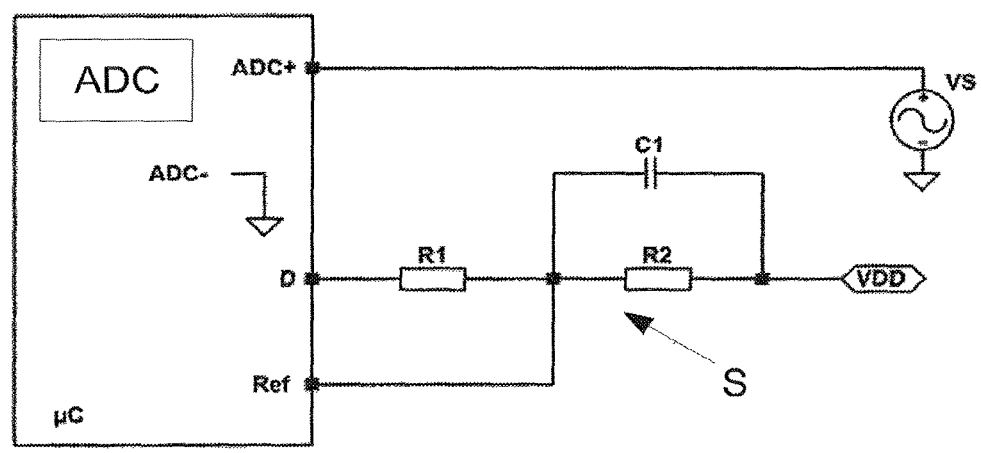
FIG. 2: shows a microcontroller having circuitry according to a second exemplary embodiment.

FIG. 2 shows a microcontroller having circuitry according to a second exemplary embodiment.

It should be understood that the fundamental operation of the use of a distortion signal is embodied similarly to the first exemplary embodiment. Therefore, only the differences in the second exemplary embodiment in relation to the first exemplary embodiment are discussed below.

In contrast to the analog-to-digital converter ADC of the first exemplary embodiment, the analog-to-digital converter ADC of the second exemplary embodiment has no differential input. It has merely a positive connection ADC+ to which the signal VS to be digitized is connected. Measurements are taken relatively to a purely internal negative connection ADC− that is hardwired to ground and unalterable.

The microcontroller μC has a digital output D in the same way as in the first exemplary embodiment. Said output is likewise coupled to a voltage divider S having two resistors R1, R2, with a capacitor C1 being interconnected across the second resistor R2. In contrast to the first exemplary embodiment, however, the voltage divider S has its end opposite the digital connection D connected not to ground but rather to a supply voltage VDD. In principle, this allows a distortion signal to be produced in a very similar manner to that described with reference to the first exemplary embodiment.

As a further difference, the output of the voltage divider S, to which the capacitor C1 is also connected, is connected not to the negative connection ADC− but rather to the reference connection. This reference connection is an input for a reference potential that is used in the analog-to-digital converter ADC and that divides the signal applied to the positive connection ADC+ before it is digitized. In the present case, the superimposition is thus effected not by means of a summation or subtraction, but rather by means of a division. In the case of the second exemplary embodiment, the microcontroller μC is programmed such that it likewise forms mean values, but taking into consideration the differently superimposed distortion signal. This allows a conversion from temporal resolution into a better sampling resolution to be performed in the same way.

Figure 3:
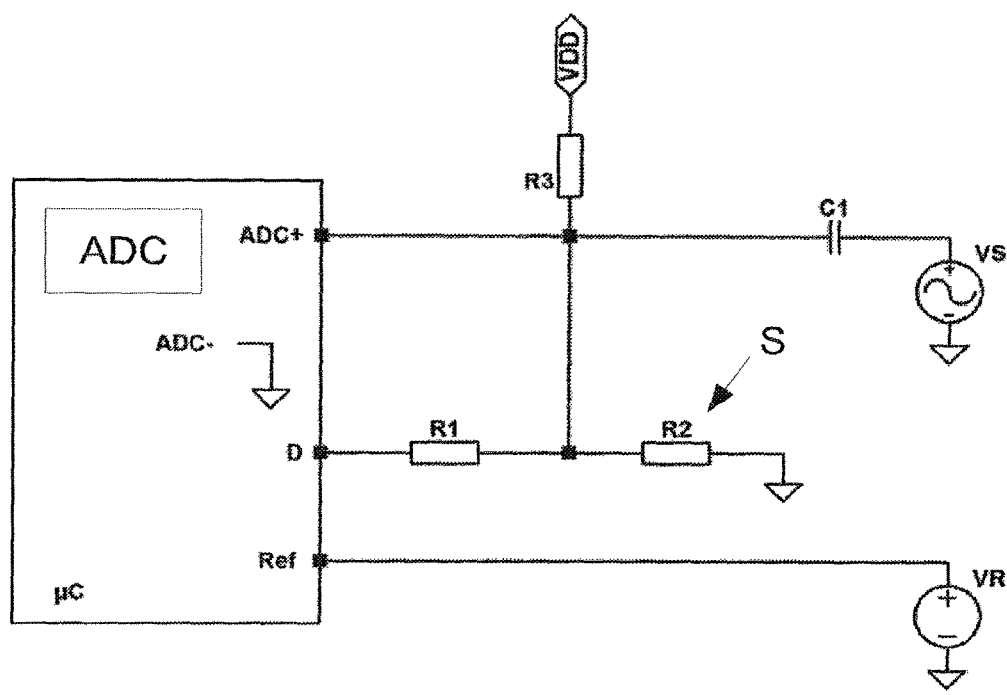
FIG. 3: shows a microcontroller having circuitry according to a third exemplary embodiment.

FIG. 3 shows a microcontroller μC having circuitry according to a third exemplary embodiment. In this case, in contrast to the first and second exemplary embodiments, the distortion signal is not coupled directly to the microcontroller μC, but rather the distortion signal is superimposed on the signal VS to be digitized instead. In this case, the signal VS to be digitized is coupled by means of a capacitor C1, so that it is coupled by AC voltage. A DC voltage component of the signal VS is therefore masked out. The digital output D of the microcontroller μC is connected to a voltage divider S in the same way as in FIG. 1, said voltage divider having two resistors R1, R2 and having its end opposite the digital output D connected to ground. The output of the voltage divider S, which is situated between the resistors R1, R2, is connected to the capacitor C1. The same connection is also connected to the positive connection ADC+. Moreover, it is connected to a third resistor R3, which has its opposite connection in turn connected to a supply voltage VDD. The reference input Ref of the microcontroller μC is firmly connected to a reference potential VR in the present case.

The circuitry described and shown in FIG. 3 superimposes the distortion signal, the absolute value of which is matched by means of the voltage divider S as already described further above, directly on the signal VS to be digitized before the latter is coupled into the analog-to-digital converter ADC. Although the circuitry shown in FIG. 3 has a somewhat different transfer characteristic than an adder embodied with active components such as operational amplifiers, for example, this transfer characteristic is sufficient for typical applications. In particular, it can be compensated for in the computations performed by the microcontroller μC. Dispensing with active components achieves a marked decrease in complexity and costs.

The claims that are part of the application do not constitute dispensing with attaining further protection.

If, in the course of the procedure, it is found that a feature or a group of features is not absolutely necessary, then the applicant is right now seeking a wording for at least one independent claim that no longer has the feature or the group of features. This may be, by way of example, a subcombination of a claim available on the filing date or a subcombination of a claim available on the filing date restricted by further features. Such claims or combinations of features to be reworded are intended to be understood as also covered by the disclosure of this application.

It should further be pointed out that configurations, features and variants of the invention that are described in the different embodiments or exemplary embodiments and/or are shown in figures are combinable with one another arbitrarily. Single or multiple features are interchangeable with one another arbitrarily. Combinations of features that result from this are intended to be understood as also covered by the disclosure of this application.

Back-references in dependent claims are not intended to be understood as dispensing with attaining independent, substantive protection for the features of the back-referenced subclaims. These features can also be combined with other features arbitrarily. Features that are merely disclosed in the description or features that are disclosed in the description or in a claim only in conjunction with other features may fundamentally be of separate significance essential to the invention. They can therefore also be included individually in claims to distinguish from the prior art.

The invention claimed is:

1. An apparatus for digitizing an analog signal, comprising:
   an analog-to-digital converter having a signal input for the analog signal, and
   a distortion signal generator having a distortion signal output, wherein the distortion signal generator is designed to deliver a distortion signal at the distortion signal output, wherein
   the distortion signal output is coupled to the analog-to-digital converter exclusively by passive components.

2. The apparatus as claimed in claim 1, wherein
   the distortion signal output is coupled to the analog-to-digital converter without active components.

3. The apparatus as claimed in claim 2, wherein the analog-to-digital converter is part of a microcontroller.

4. The apparatus as claimed in claim 1, wherein
   the analog-to-digital converter is part of a microcontroller.

5. The apparatus as claimed in claim 4, wherein
   the distortion signal generator is also part of the microcontroller.

6. The apparatus as claimed in claim 5, wherein
   the distortion signal generator is implemented by a digital output of the microcontroller, which forms the distortion signal output.

7. The apparatus as claimed in claim 1 wherein,
   the analog-to-digital converter has a differential input, and
   wherein the distortion signal output is coupled to a connection of the differential input.

8. The apparatus as claimed in claim 7, wherein
   the distortion signal output and a reference potential have a voltage divider connected between them, and
   wherein the connection of the differential input is connected to an output of the voltage divider.

9. The apparatus as claimed in claim 8, wherein
   the connection of the differential input and the reference potential have a capacitor connected between them,
   which spans at least one resistor of the voltage divider.

10. The apparatus as claimed in claim 8, wherein
    a resistor of the voltage divider that is connected between the distortion signal output and the output of the voltage divider is larger than a second resistor that is connected between the output of the voltage divider and the reference potential.

11. The apparatus as claimed in claim 8, wherein the reference potential is ground.

12. The apparatus as claimed in claim 1, wherein
    the analog-to-digital converter has a reference input in addition to the signal input, and
    wherein the distortion signal output is coupled to the reference input.

13. The apparatus as claimed in claim 12, wherein
    the distortion signal output and a reference potential have a voltage divider connected between them, and
    wherein the reference input is connected to an output of the voltage divider.

14. The apparatus as claimed in claim 13, wherein
    the reference input and the reference potential have a capacitor connected between them,
    which spans at least one resistor of the voltage divider.

15. The apparatus as claimed in claim 13, wherein the reference potential is a positive potential.

16. The apparatus as claimed in claim 1, wherein
    the distortion signal output and a signal connection delivering the signal are coupled to the signal input.

17. The apparatus as claimed in claim 16, wherein
    the distortion signal output is coupled by DC voltage to the signal input, and
    the signal connection is coupled by AC voltage to the signal input.

18. The apparatus as claimed in claim 17, wherein the distortion signal output and a reference potential have a voltage divider connected between them, and
    wherein the signal input is connected to an output of the voltage divider.

19. The apparatus as claimed in claim 16, wherein
    the distortion signal output and a reference potential have a voltage divider connected between them, and
    wherein the signal input is connected to an output of the voltage divider.

20. The apparatus as claimed in claim 1, wherein the distortion signal output is coupled to the analog-to-digital converter without an operational amplifier.

* * * * *